(12) United States Patent
Narita et al.

(10) Patent No.: US 7,791,364 B2
(45) Date of Patent: Sep. 7, 2010

(54) ELECTRONIC DEVICE PROBE CARD WITH IMPROVED PROBE GROUPING

(75) Inventors: Satoshi Narita, Hirosaki (JP); Hisao Narita, Hirosaki (JP); Nobuyuki Yamaguchi, Hirosaki (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 42 days.

(21) Appl. No.: 12/269,822

(22) Filed: Nov. 12, 2008

(65) Prior Publication Data

US 2009/0140760 A1      Jun. 4, 2009

(30) Foreign Application Priority Data

Dec. 3, 2007    (JP)    ............... 2007-312587

(51) Int. Cl.
*G01R 31/26* (2006.01)
(52) U.S. Cl. ...................................... 324/762
(58) Field of Classification Search .......... 324/754–762
See application file for complete search history.

(56) References Cited

U.S. PATENT DOCUMENTS

| | | | | |
|---|---|---|---|---|
| 5,742,174 A * | 4/1998 | Kister et al. | ................. | 324/762 |
| 5,892,366 A * | 4/1999 | Byers | ......................... | 324/758 |
| 5,952,843 A * | 9/1999 | Vinh | .......................... | 324/761 |
| 6,078,500 A * | 6/2000 | Beaman et al. | ............. | 361/704 |
| 6,174,744 B1 * | 1/2001 | Watanabe et al. | ............. | 438/14 |
| 6,475,822 B2 * | 11/2002 | Eldridge et al. | ............... | 438/52 |
| 6,482,013 B2 * | 11/2002 | Eldridge et al. | ............... | 439/66 |
| 6,727,580 B1 * | 4/2004 | Eldridge et al. | ............. | 257/692 |
| 7,073,254 B2 * | 7/2006 | Eldridge et al. | ............... | 29/843 |
| 7,492,175 B2 * | 2/2009 | Smith et al. | ................. | 324/754 |
| 7,601,039 B2 * | 10/2009 | Eldridge et al. | ............. | 439/894 |
| 7,629,807 B2 * | 12/2009 | Hirakawa et al. | ........... | 324/762 |
| 7,679,388 B2 * | 3/2010 | Chen et al. | ................... | 324/762 |
| 2003/0199179 A1 * | 10/2003 | Dozier et al. | ................. | 439/66 |

FOREIGN PATENT DOCUMENTS

| | | |
|---|---|---|
| JP | 2000216204 | 8/2000 |
| JP | 2001108708 | 4/2001 |
| JP | 2003014780 | 1/2003 |

OTHER PUBLICATIONS

Pat. Abstract of JP (200216204), Aug. 4, 2000, NEC Corp.
Pat. Abstract of JP (2001108708), Apr. 20, 2001, Micronics Japan Co. LTD.
Pat. Abstract of JP (2003014780), Jan. 15, 2003, Micronics Japan Co. LTD.

* cited by examiner

*Primary Examiner*—Ha Tran T Nguyen
*Assistant Examiner*—Joshua Benitez
(74) *Attorney, Agent, or Firm*—Ingrassia Fisher & Lorenz, P.C.

(57) ABSTRACT

The probe card includes a plurality of probes arranged on one surface side of a board. These probes belonging to any one of a first probe group including a plurality of probes contacting respective electrodes in a first electrode row of an electronic device, a second probe group including a plurality of probes contacting respective electrodes in a second electrode row of the electronic device, and a third and fourth probe groups respectively including a plurality of probes contacting respective electrodes in a middle electrode row of the electronic device alternately.

7 Claims, 14 Drawing Sheets

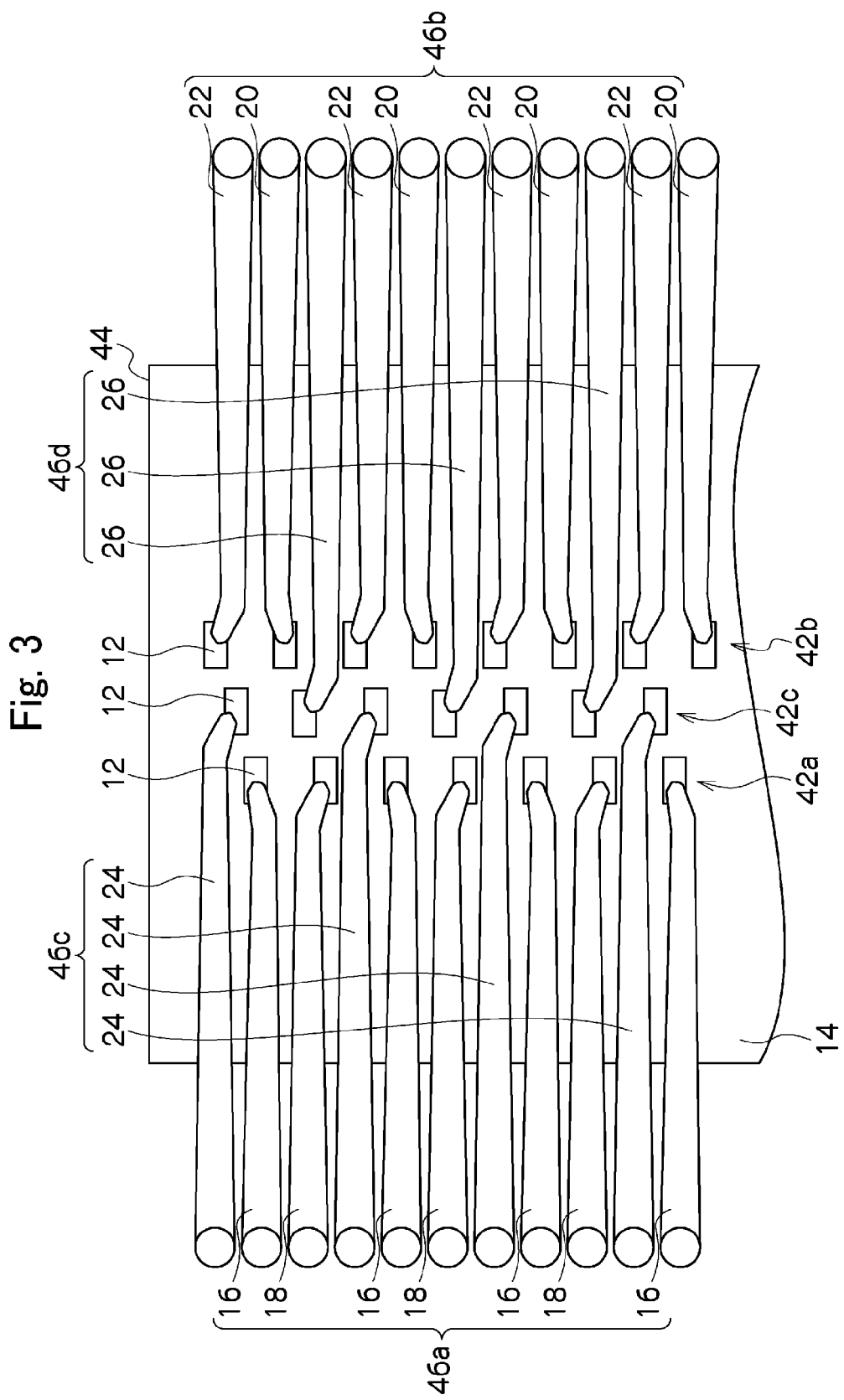

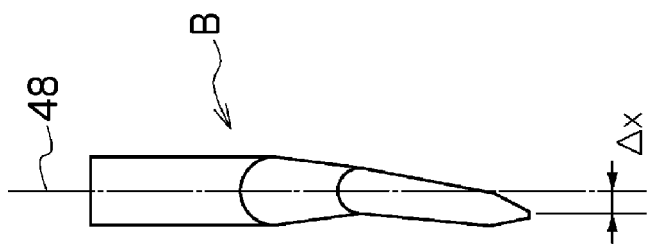
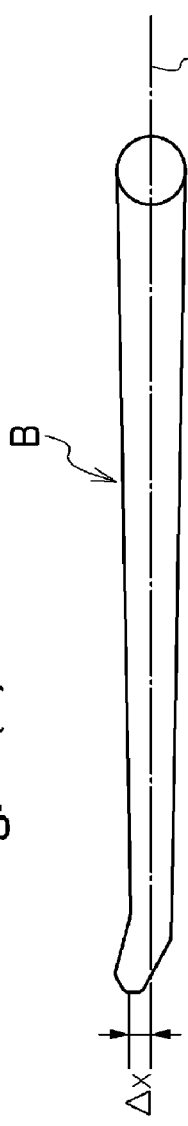
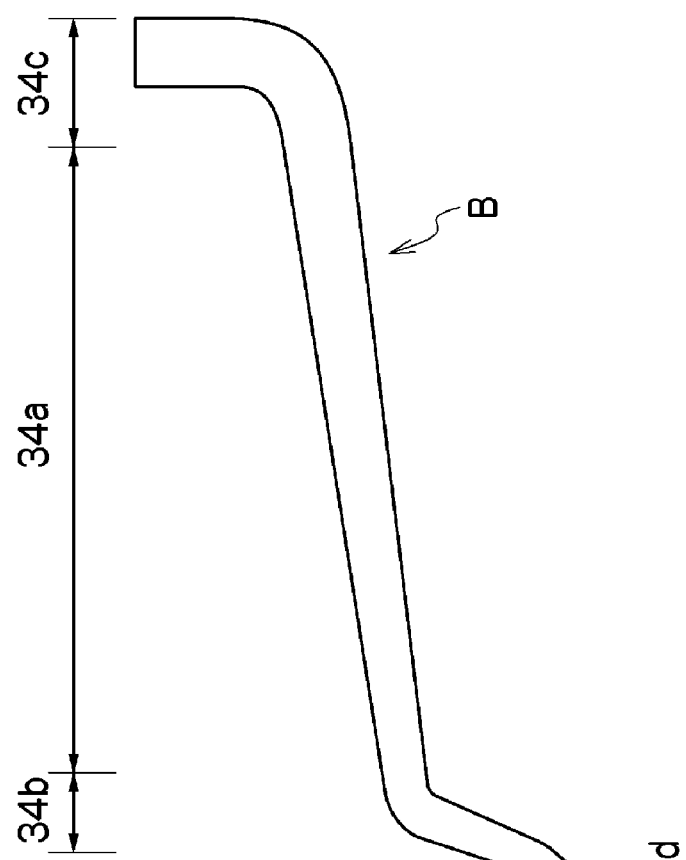
Fig. 4(A)
Fig. 4(B)
Fig. 4(C)

ELECTRONIC DEVICE PROBE CARD WITH IMPROVED PROBE GROUPING

TECHNICAL FIELD

The present invention relates to a probe card utilized for performing an electrical test of an electronic device such as a semiconductor element.

BACKGROUND OF THE INVENTION

In general, a probe card comprises multiple elongated probes and is utilized for performing an electrical test of an electronic device by bringing a probe tip portion, particularly the probe tip of each probe into contact with each electrode of the electronic device in one-to-one relationship to supply power to the electronic device.

In recent years, such an electronic device proceeds to trends of miniaturization and high integration along with social needs and technological advances supporting them, so that electrodes of the electronic device are miniaturized, and their pitch is reduced. In addition, in some electronic devices, the electrodes are arranged in multiple rows, and the positions and pitches of the electrodes differ per row.

In a case of performing an electrical test of such an electronic device, a possibility has been increased that probes adapted to the reduced pitches between the electrodes and the pitches different per electrode pair may contact each other.

Conventionally, various means to prevent such contact between the probes are proposed. For example, there is a probe card in which a plurality of probes are arranged in the state that probe tips thereof are in zigzags alternately in the right-left direction of electrodes of an electronic device and that the probes do not intersect with one another (Patent Document 1). Also, there is a probe card in which a plurality of probes are divided into two groups consisting of a first probe group in which a probe main body portion extends to one side from a probe tip portion and a second probe group in which the probe main body portion extends to the other side from the probe tip portion, wherein the probes in the first and second probe groups are located alternately in the arrangement direction of their probe tips (Patent Document 2). Further, there is a probe card in which a probe in a first layer, a probe in a second layer, and a probe in a third layer (lowest layer) are fixed at an interval in up and down direction on the lower surface of a needle holder, and which probes in any one of the layers are used to correspond to the positions of electrodes of an electronic device (Patent Document 3).

Document

[Patent Document 1] Japanese Patent Appln. Public Disclosure. No. 2000-216204 (Paragraph 0017)

[Patent Document 2] Japanese Patent Appln. Public Disclosure No. 2001-108708 (claim 2)

[Patent Document 3] Japanese Patent Appln. Public Disclosure No. 2003-14780 (Paragraph 0011, etc.)

However, in the conventional case where, in an electronic device having a plurality of electrode rows, the electrode pitches differ per row, and the positions of the electrodes are displaced in the row direction per row, since the probe pitch is uniform, the conventional probe cards cannot let each probe contact each electrode in one-to-one relationship and have difficulty in performing an electrical test of the aforementioned electronic device.

Especially, for a customized electronic device in which multiple electrodes are irregularly arranged, the conventional probe cards cannot be configured to contact the probes with the electrodes in one-to-one relationship.

Also, when an electronic device whose electrode pitch in each row is narrower than the probe pitch is to be tested by the conventional probe card having such probes, the probes contact one another, and an electronic test cannot be performed.

SUMMARY OF THE INVENTION

Technical Problem

It is an object of the present invention to let a probe tip of a probe contact an electrode of an electronic device having a plurality of electrodes, e.g., an electronic device in which the electrodes are arranged in three or more rows, and in which each row is arranged to be displaced from the other rows, reliably in one-to-one relationship without contacting the adjacent probes from each other.

Solution to Problem

A probe card according to the present invention comprises a board having a lower surface of which a plurality of connection portions are arranged; and first, second, third, and fourth probe groups each including a plurality of probes each having a probe base portion connected to the connection portion at its upper end, a probe main body portion extending in a right-left direction from the lower end of the probe base portion, and a probe tip portion extending downward from the tip end of the probe main body portion and having a probe tip at its lower end.

The probe main body portions of the probes in the first and third probe groups extend from the lower ends of the corresponding probe base portions to the side of the probes in said second and fourth probe groups. The probe main body portions of said probes in said second and fourth probe groups extend from the lower ends of the corresponding probe base portions to the side of the probes in the third probe groups. The probe tips of the probes in said third and fourth probe groups are located alternately in a front-back direction.

The plurality of connection portions may belong to one or the other of the first and second connection portion groups, and the connection portions belonging to the first connection portion group and the connection portions belonging to the second connection portion group may be arranged on the lower surface of the board to be spaced in the right-left direction. The probe tip portion of each of the plurality of probes belonging to each probe group may be bent to one or the other side in the front-back direction relative to a longitudinal axis of the probe main body portion.

Also, a direction in which the probe tip portion of each probe in the third probe group is bent and a direction in which the probe tip portion of each probe in the fourth probe group is bent may be different from each other. Further, directions in which the probe tip portions of two probes belonging to the probes in the first probe group, the two probes being most adjacent to the probes in the third probe group, are bent may be different from each other, and directions in which the probe tip portions of two probes belonging to the probes in the second probe group, the two probes being most adjacent to the probes in the fourth probe group, are bent may be different from each other.

Also, the probe tips of the probe tip portions of the most adjacent two probes belonging to the probes in the first probe group may be mutually displaced in the right-left direction, and the probe tips of the probe tip portions of the most adjacent two probes belonging the probes in the second probe group may be mutually displaced in the front-back direction.

The probe tips may be located on imaginary straight line extending in the front-back direction. Also, each of the third and fourth probe groups may include at least two probe sub-groups. Further, the probe tips of the probes in the two probe sub-groups may be located in a configuration of two rows in the front-back direction, and the probe tips in each row may be arranged on an imaginary straight line.

ADVANTAGEOUS EFFECTS OF INVENTION

With the probe card according to the present invention, since the probe tips of the probes in the third and fourth probe groups are located alternately in the front-back direction, the probes belonging to the third and fourth probe groups can be located without contacting the adjacent probes one another.

Especially, the probes belonging to the third and fourth probe groups can be arranged alternately in the array direction such that the probe tips thereof contact respective electrodes in intermediate electrode rows on an electronic device having three or more rows, without contacting the adjacent probes one another.

BRIEF DESCRIPTION OF THE DRAWINGS

FIG. 3 is an enlarged schematic plan view of a probe arrangement obtained along the line 3-3 in FIG. 1, omitting illustration of needle holders.

FIG. 4 (A) is a plan view of a probe used in the probe card according to the present invention.

FIG. 4 (B) is a side view of the probe shown in FIG. 4 (A).

FIG. 4 (C) is a front view of the probe shown in FIG. 4 (A).

DETAILED DESCRIPTION OF THE INVENTION

Hereinafter, preferred embodiments of the present invention will be described with reference to the drawings.

About Terms

Figure 2:
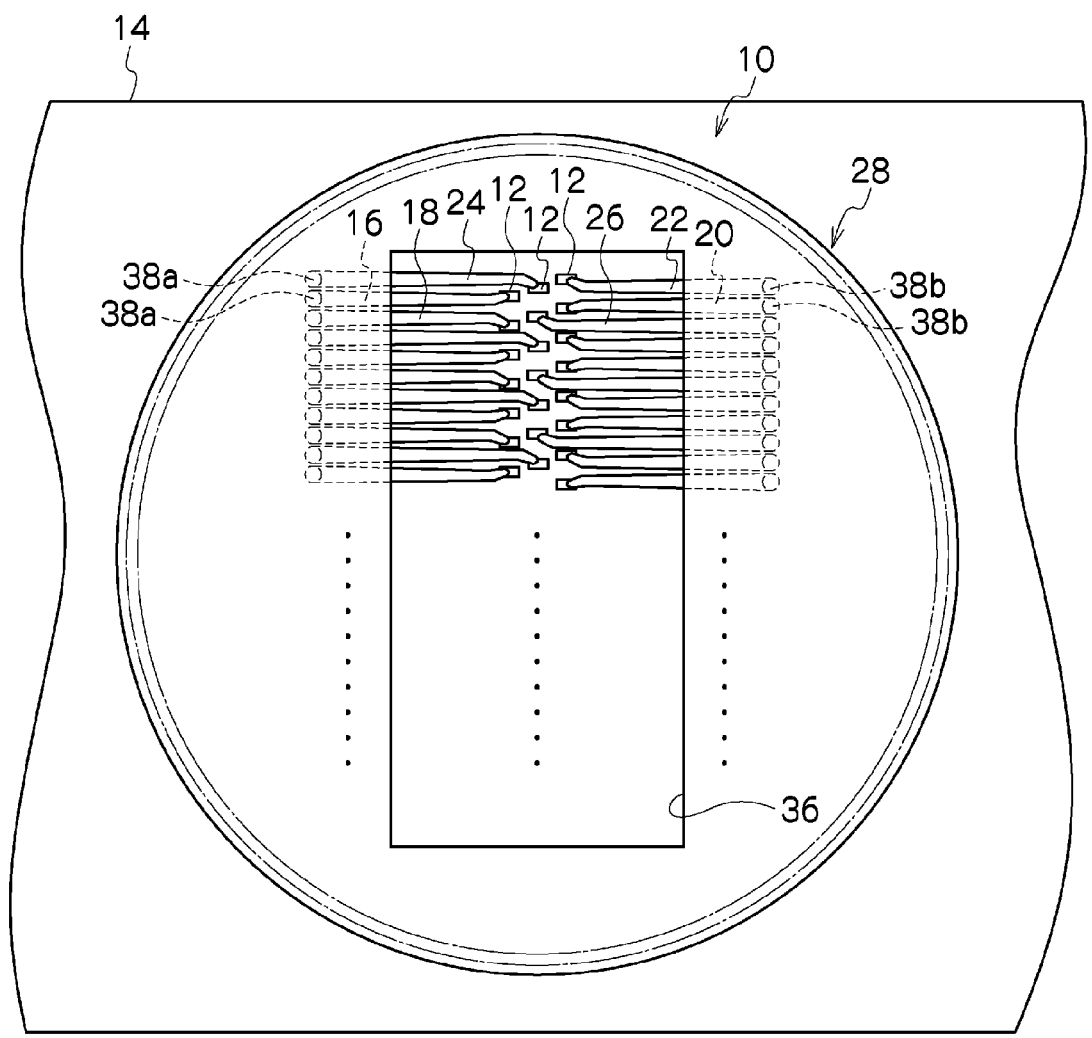
FIG. 2 is a plan view of the probe card shown in FIG. 1.

Meanwhile, in the present invention, a column direction of electrodes of an electronic device or a column direction of probes (the up-down direction in FIGS. 2 and 3) is referred to as the front-back direction, a direction intersecting the front-back direction and a direction in which a probe main body portion of the probe extends (the right-left direction in FIGS. 2 and 3) is referred to as the right-left direction, and a direction perpendicular to the drawing sheet in FIGS. 2 and 3 is referred to as the up-down direction. However, these directions differ depending on the posture of the electronic device when the electronic device as a device under test is arranged in a testing apparatus to which a probe card is attached.

First Embodiment

A first embodiment of the probe card according to the present invention will be described with reference to FIGS. 1 to 4.

Figure 1:
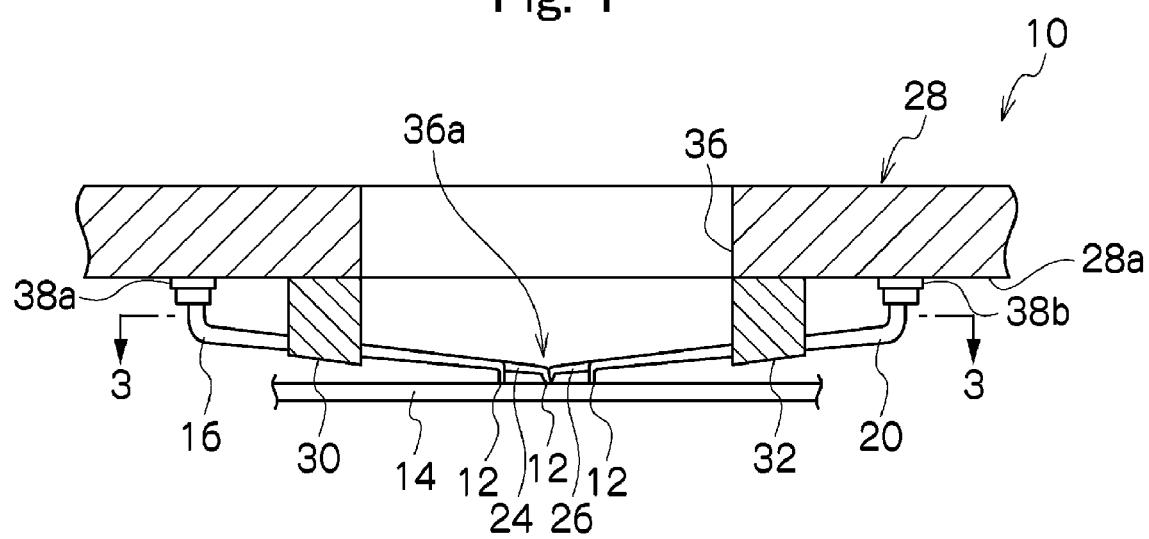
FIG. 1 is a schematic cross-sectional view showing a first embodiment of a probe card according to the present invention together with an electronic device.

Referring to FIGS. 1 and 2, a probe card 10 is used for an electrical test measuring electrical characteristics of an electronic device 14 such as a semiconductor integrated circuit having a plurality of electrodes 12 arranged in three rows at an interval from each other in the right-left direction as mentioned later. In the example shown in the figures, a part of the electronic device 14 is shown and each electrode 12 is formed in a rectangular shape. Although the electrode 12 is shown to have a small thickness dimension, the probe card 10 can be applied to an electrode having large thickness dimension such a bump electrode.

In the probe card 10, a plurality of probes 16, 18, 20, 22, 24, 26 are arranged on a lower surface 28a of a board 28 in a state where their probe tips 34d (FIG. 4(B)) are arranged on imaginary straight lines extending in the front-back direction above the electrodes 12 in each row (FIGS. 2 and 3). In the example shown in the figures, each probe is a needle type made of a conductive metal fine wire. The probes 16, 18, 24 are mounted on the board 28 by one needle holder 30, and the probes 20, 22, 26 are mounted on the board 28 by the other needle holder 32.

Each of the probe is bent downward in one or the other side of the front-back direction. Each of the probes is incorporated in the needle holder 30 or 32 at a main body portion 34a (FIG. 4 (B)) by adhesive in a state where a probe tip portion 34b (FIG. 4 (B)) is directed downward. Each probe 16, 18, 20, 22, 24 and 26 is formed in a conical shape (that is, tapered shape), in which the diameter dimension is reduced further toward the probe tip side.

The board 28 is a wiring board having a rectangular opening 36 at the center portion, having a plurality of wirings (not shown) around the opening 36, and having a plurality of connection portions (connection lands) 38a, 38b electrically connected individually to these wirings, and is made of an electrically insulating material. The rear end portion of each probe 34c (FIG. 4 (B)) is electrically connected to the connection portions 38a or 38b formed on the board 28 by bonding material such as solder, conductive adhesive, or the like.

In the example shown in the figures, the connection portions 38a and 38b are formed respectively on the lower surface 28a of the board 28 in a configuration of one row on the left side and one row on the right side to be spaced in the front-back direction for each low.

In the figures, the connection portions 38a on the left row are lands for the probes 16, 18, 24. In the same manner, the connection portions 38b on one row on the right side are lands for the probes 20, 22, 26.

As shown in FIGS. 1 and 2, each probe is connected to the corresponding connection portion in a cantilevered manner, and the probe tip 34d of the probe tip portion 34b of each probe is located in a lower space 36a of the opening 36 of the board 28. Although the connection portions are formed in the configuration of one row on the left side and one row on the right side in the example shown in the figures, they may be configured to have multiple rows spaced in the front-buck direction.

The needle holders 30 and 32 are mounted on the lower sides of portions corresponding to two opposed sides of the opening 36 of the board 28 by adhesive, plural screw members, etc. Although the needle holders 30, 32 are formed as separated parts in the example shown in the figures, they may be formed as one part.

In the probes 16, 18, 24 mounted on the needle holder 30, the height positions of the main body portions 34a from the board 28 are identical with each other, and the main body portions 34a extend from the probe tip portions 34b thereof in an identical direction, wherein the identical direction is a direction opposite the side of the probes 20, 22, 26. In the probes 20, 22, 26 mounted on the other needle holder 32, the height positions of the main body portions 34a from the board 28 are identical with each other, and the main body portions 34a extend from the probe tip portions 34b thereof in an identical direction, wherein the identical direction is a direction opposite the side of the probes 16, 18, 24.

FIG. 3 is an enlarged schematic plan view showing the arrangement of the plural probes 16, 18, 20, 22, 24, 26 of the probe card 10 in FIG. 1. Each of the probes 16, 18, 20, 22, 24 and 26 contacts each of the plurality of electrodes 12 of the electronic device 14 in one-to-one relationship.

In the figures, each of the electrodes 12 in the electronic device 14 belongs to any one of the first, second and third electrode rows 42a, 42b and 42c. The electrodes 12 in each of the electrode rows 42a, 42b and 42c are arranged to be equally spaced from one another in the front-back direction. Also, the electrodes in each of the electrode rows are arranged to be slightly displaced from the electrodes in other electrode rows in their row direction (in the front-back direction), and their electrode rows are not aligned in the right-left direction.

In the example shown in the figures, the first electrode row 42a and the second electrode row 42b are a first row and a last row (third row), respectively, and the third electrode row 42c is an intermediate row. In each of the first electrode row 42a and the third electrode rows 42c, seven electrodes 12 are shown, and in the second electrode row 42b, eight electrodes 12 are shown. The order of the electrodes closer to an end portion 44 of the electronic device 14 is the first electrode 12 in the second electrode row 42b, the first electrode 12 in the third electrode row 42c, and the first electrode 12 in the first electrode row 42a, and subsequently the electrodes are arranged in the respective electrode rows in this order.

Plural probes 16, 18 form a first probe group 46a of which the probe tips thereof are located on the leftmost side, plural probes 20, 22 form a second probe group 46b of which the probe tips thereof are located on the rightmost side. Also, plural probes 24 form a third probe group 46c of which the probe tips thereof are located on the right side of the first probe group 46a, and plural probes 26 form a fourth probe group 46d of which the probe tips thereof are located on the left side of the second probe group 46b.

At the time of a test of the electronic device 14, the probe tip of each probe in the first probe group 46a is brought into contact with each electrode in the first electrode row 42a in one-to-one relationship, and the probe tip of each probe in the second probe group 46b is brought into contact with each electrode in the second electrode row 42b in one-to-one relationship. The probe tips of the probes 24, 26 in the third probe group 46c and the fourth probe group 46d are brought into contact with the third electrode row 42c alternately in one-to-one relationship.

Each probe belongs to any one of two types of probes A and B, as mentioned later, the bending direction of whose probe tip portions are different. Each of the probes 16 and 20 is constituted by probe A of a first type, and each of the probes 18 and 22 is constituted by probe B (FIG. 4 (B)) of a second type. Also, each of the probes 24 and 26 is constituted by probe B of the second type.

Each probe 24 in the third probe group 46c is located between a pair of the probes 16 and 18 adjacent to each other belonging to the first probe group 46a in which the bending directions of the probe tip portions of the pair of the probes 16 and 18 intersect each other. Also, each probe 26 in the fourth probe group 46d is located between a pair of probes 22 and 20 adjacent to each other in the second probe group 46b in which the bending directions of probe tip portions of the pair of probes 22 and 20 intersect each other.

In the example shown in FIG. 3, the probe tip of each probe in the third probe group 46c is bent in a direction opposite the end portion 44 (backward in the front-back direction), and the probe tip of each probe in the fourth probe group 46d is bent in a direction toward the end portion 44 (forward in the front-back direction).

In FIGS. 4 (A) to 4 (C), the shape of probe B of the second type is shown. As shown in FIG. 4(C), the bending directions of the probe A and B are symmetrical, i.e., opposite to each other relative to the longitudinal direction of the main body 34a Probe B includes a probe base portion 34c extending as much as a predetermined length in a vertical downward direction from the connection portion 38a or the like of the probe card 10 and bent downward in the lowest portion at an obtuse angle close to 90 degrees, above mentioned main body portion 34a extending linearly from the tip end portion of the probe base portion, and above mentioned probe tip portion 34b bent downward from the main body portion 34a at an obtuse angle close to 90 degrees. Probe B is a needle formed integrally from the end portion of the probe base portion 34c through the probe tip 34d of the probe tip portion 34b as a whole and gradually decreasing its diameter continuously. The probe tip portion 34b has the probe tip 34d displaced by Δx relative to a longitudinal axis line 48 of the main body portion 34a. The probe tip portion of each probe is bent relative to the probe main body portion so that the probe tip may be located closer to the side of a probe belonging to the other probe group than to a boundary portion between the probe main body portion and the probe tip portion.

In the example shown in FIG. 4(C), the bending direction of the probe tip portion 34d displaced by Δx is on the left relative to the longitudinal axis of the main body portion 34a as viewed by an observer facing the probe B in the figure.

In the example shown in FIG. 3, the probe tip portions 34b of the probes 16, 22, 26 extend obliquely in a direction toward the end portion 44 from the probe main body portions 34a, and the probe tip portions 34b of the probes 18, 20, 24 extend obliquely in a direction opposite the end portion 44 from the probe main body portions 34a. The probe tip 34d of each probe slides and moves relative to the corresponding electrode 12, giving an abrasive effect on the electrode 12. By doing so, since an electrical insulating film such as an oxide film existing on the surface of each electrode 12 is abraded away, the probe and the electrode are electrically connected reliably.

Modification Example of the First Embodiment

A modification example of the first embodiment of the probe card according to the present invention will be described with reference to FIGS. 5 and 6.

Figure 5:
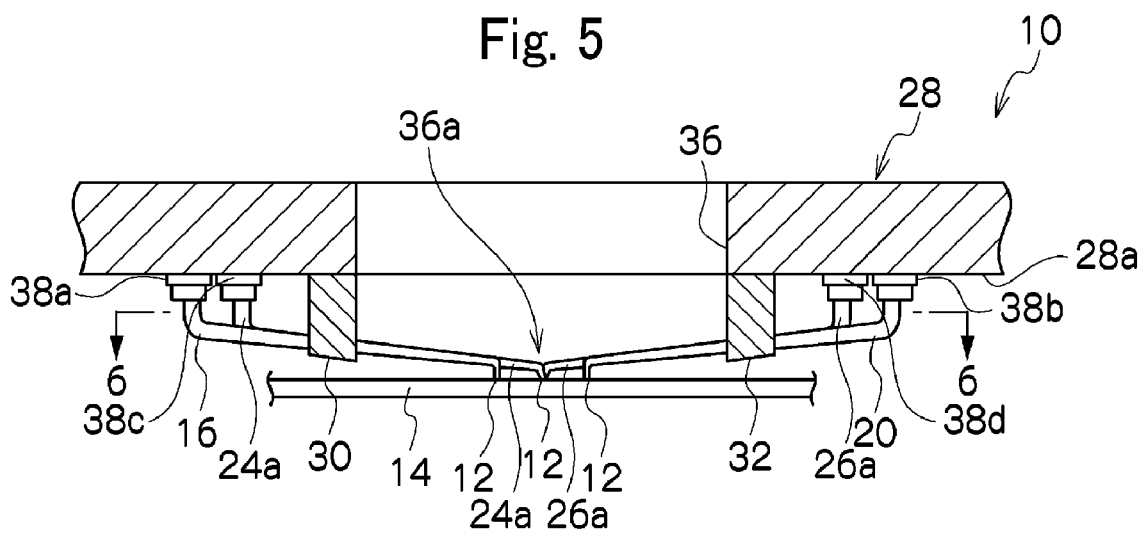
FIG. 5 is a schematic cross-sectional view showing a modification example of the probe card shown in FIG. 1 together with an electronic device.
Figure 6:
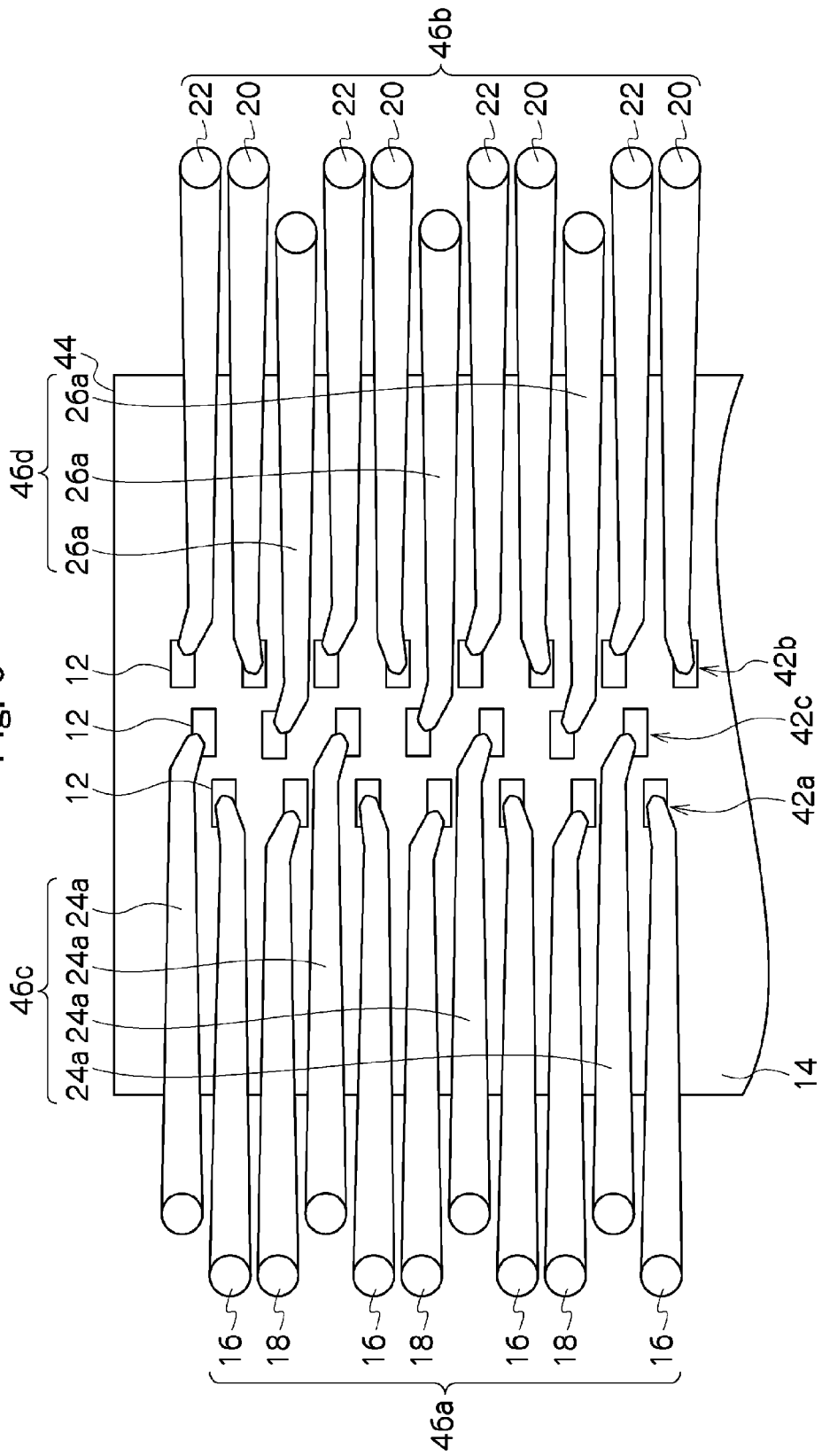
FIG. 6 is an enlarged schematic plan view of a probe arrangement obtained along the line 6-6 in FIG. 5, omitting illustration of needle holders.

FIGS. 5 and 6 show probe arrangement similar to the probe arrangement shown in FIGS. 1 to 3. It is noted that the same components as the components used in the probe card and the electronic device shown in FIGS. 1 to 3 are provided with the same reference numerals, and explanation of these is omitted.

As shown in FIG. 6, the third probe group 46c includes a plurality of probes 24a, and the fourth probe group 46d includes a plurality of probes 26a. The probe 24a shown in FIG. 6 and the probe 24 shown in FIG. 3 are identical except the fact that the positions of the connection portions of the board 28 (FIG. 5) for the probes are different. In the same manner, the probe 26a shown in FIG. 6 and the probe 26 shown in FIG. 3 are identical except the fact that the positions of the connection portions of the board 28 for the probes are different. Hereinafter, only the different respects are described.

As shown in FIG. 5, connection portions 38c for the probes 24a are arranged on position of the lower surface 28a of the board 28 in which the position is further displaced to the right side from the positions of the connection portions 38a for the probes 16, 18. Also, connection portions 38d for the probes 26a are arranged on position of the lower surface 28a of the board 28 in which the position is further displaced to the left side from the positions of the connection portions 38b for the probes 20, 22.

Second Embodiment

A second embodiment of the probe card according to the present invention will be described with reference to FIGS. 7 and 8.

Figure 7:
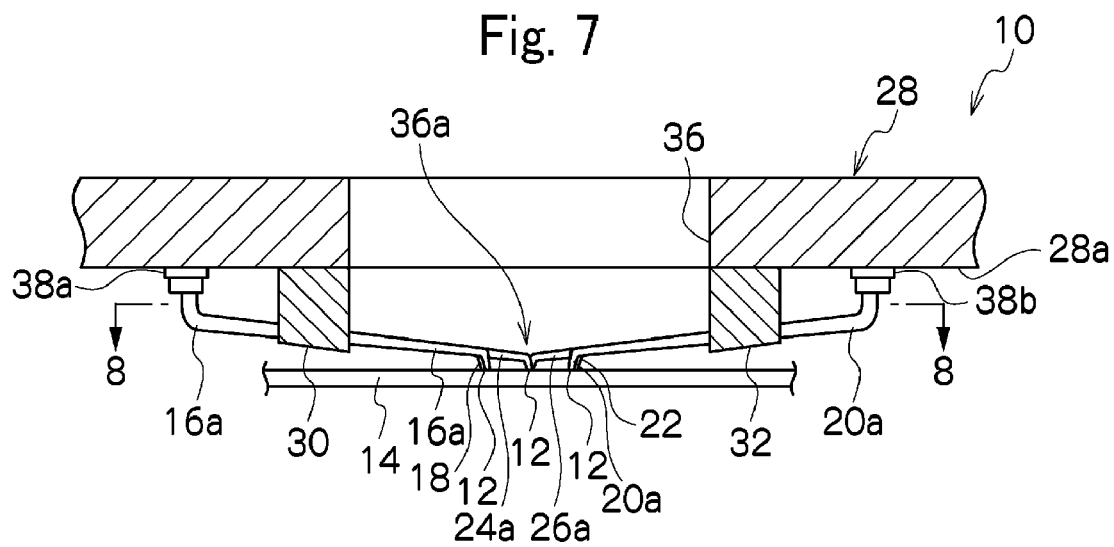
FIG. 7 is a schematic cross-sectional view showing a second embodiment of the probe card according to the present invention together with an electronic device.
Figure 8:
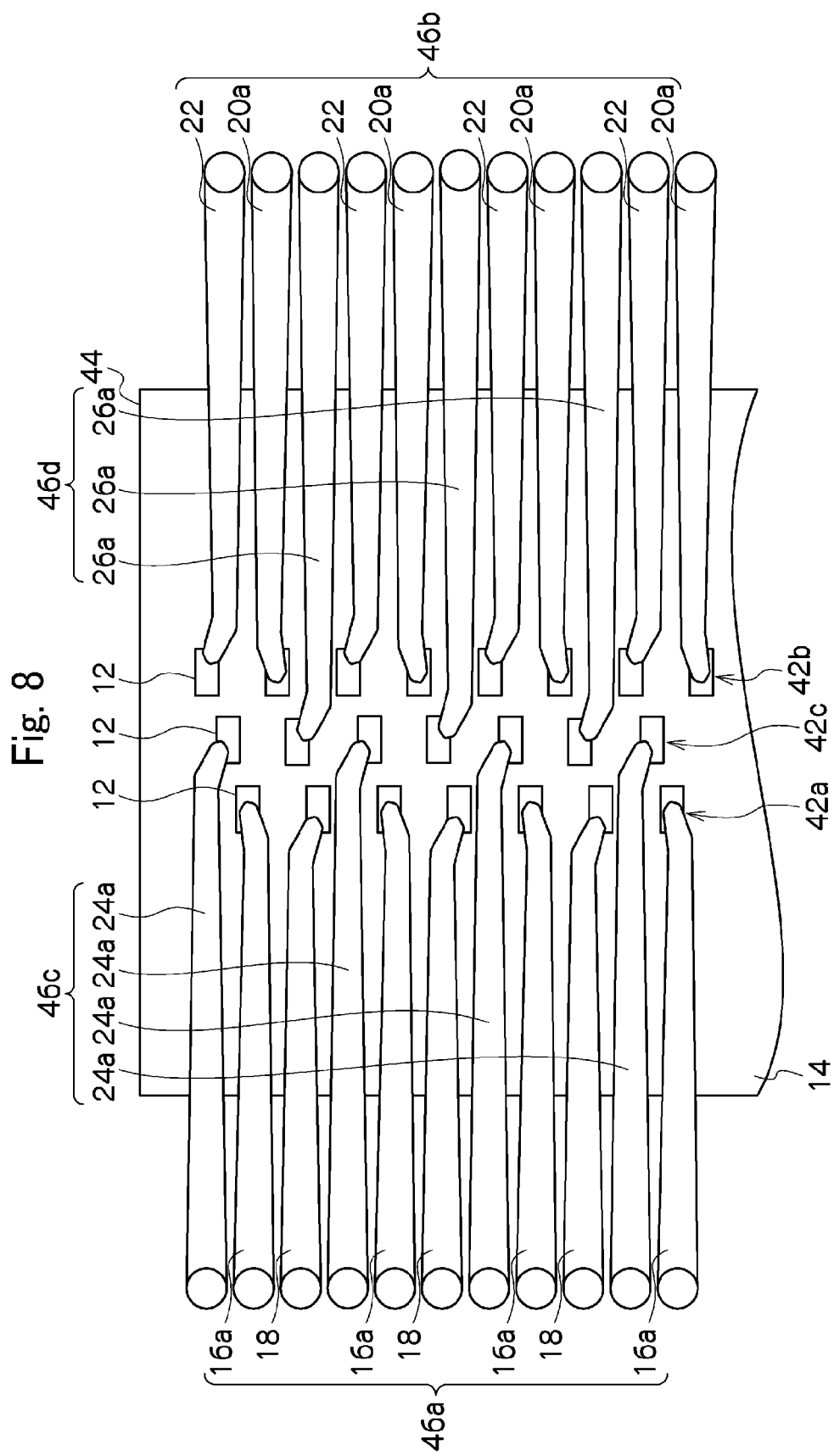
FIG. 8 is an enlarged schematic plan view of a probe arrangement obtained along the line 8-8 in FIG. 7, omitting illustration of needle holders.

FIGS. 7 and 8 show probe arrangement different from the probe arrangement shown in FIGS. 1 to 3. It is noted that the same components as the components used in the probe card, the electronic device, and the probes shown in FIGS. 1 to 4 are provided with the same reference numerals, and explanation of these is omitted.

The probe arrangement shown in FIG. 8 and the probe arrangement shown in FIG. 3 differ in terms of the probe tip positions relative to the electrodes 12 when the probes 16, 18 in the first probe group 46a and the probes 20, 22 in the second probe group 46b contact to the electrodes 12. Hereinafter, only the differences are described.

As shown in FIG. 7, the probe tip position of each probe 18 in the first probe group 46a is in the range of the left half part of the electrode 12 of the electrode row 42a, and the probe tip position of each probe 22 in the second probe group 46b is in the range of the right half part of the electrode 12 of the electrode row 42b.

Although both the probe 16a and the probe 16 are probe A of the first type, they are different in that the probe main body portion 34a of the probe 16a is longer than the probe main body portion 34a of the probe 16. Similarly, although both the probe 20a and the probe 20 are probe B of the second type, they are different in that the probe main body portion 34a of the probe 20a is longer than the probe main body portion 34a of the probe 20.

Modification Example of the Second Embodiment

A modification example of the second embodiment of the probe card according to the present invention will be described with reference to FIGS. 9 and 10.

Figure 9:
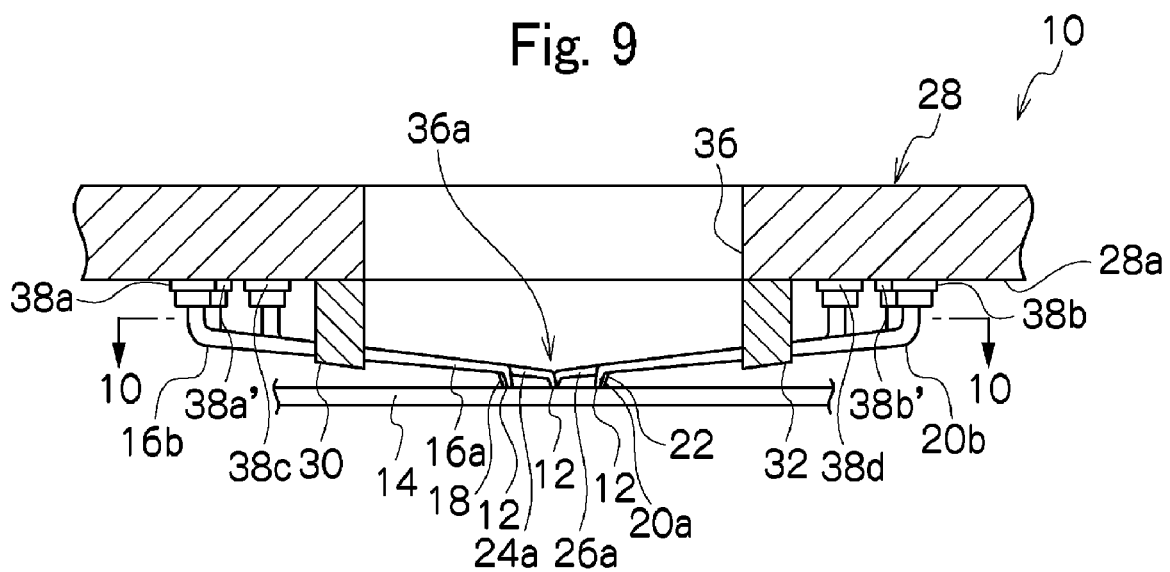
FIG. 9 is a schematic cross-sectional view showing a modification example of the probe card shown in FIG. 7 together with an electronic device.
Figure 10:
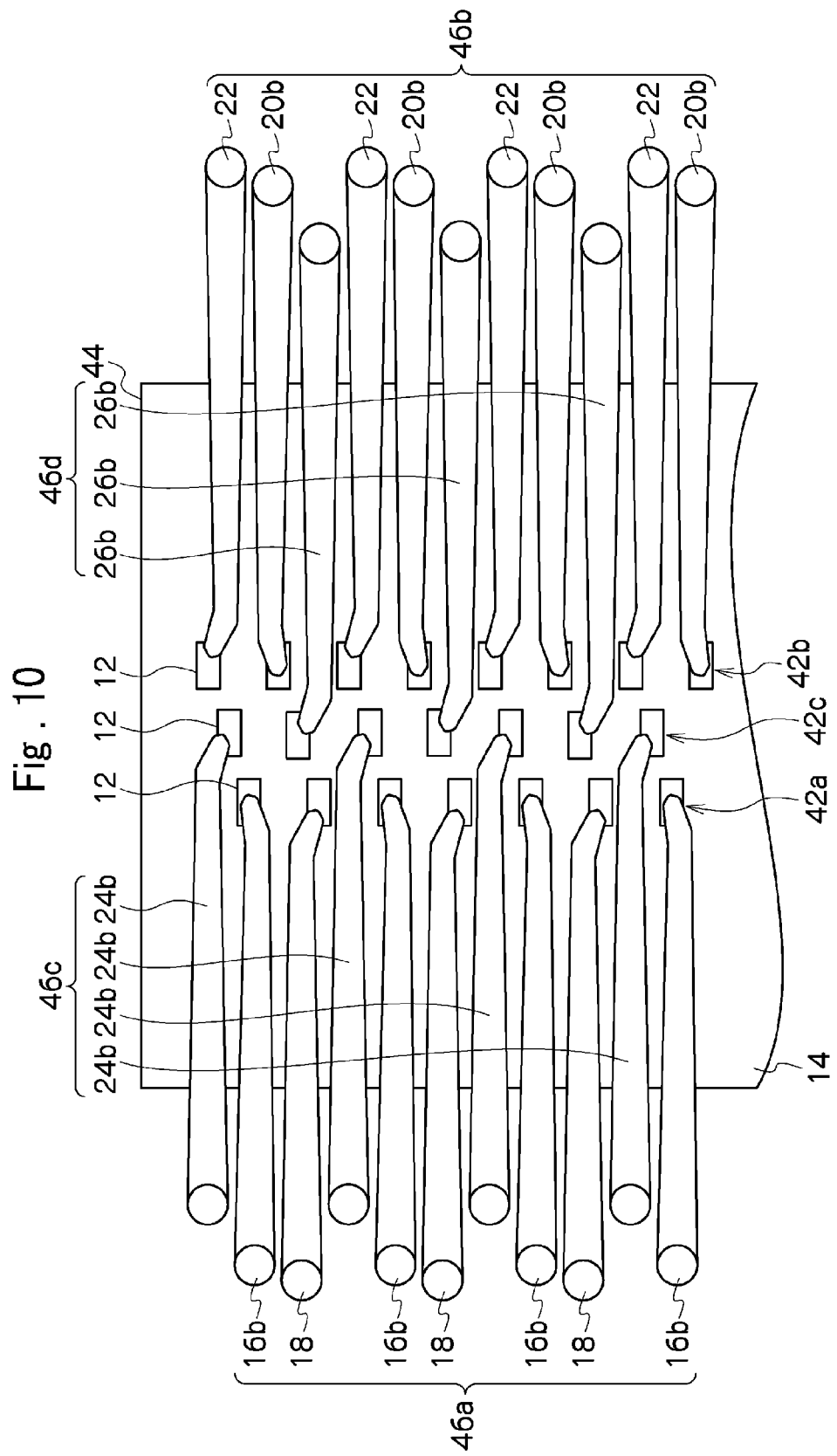
FIG. 10 is an enlarged schematic plan view of a probe arrangement obtained along the line 10-10 in FIG. 9, omitting illustration of needle holders.

FIGS. 9 and 10 show probe arrangement similar to the probe arrangement shown in FIGS. 7 and 8. It is noted that the same components as the components used in the probe card and the electronic device shown in FIGS. 7 and 8 are provided with the same reference numerals, and explanation of these is omitted.

As shown in FIG. 10, the first probe group 46a includes a plurality of probes 16b and a plurality of probes 18, and the second probe group 46b includes a plurality of probes 20b and a plurality of probes 22. The third probe group 46c includes a plurality of probes 24b, and the fourth probe group 46d includes a plurality of probes 26b.

The probe 24b shown in FIG. 10 and the probe 24a shown in FIG. 8 are identical except the fact that the positions of the connection portions to the board 28 (FIG. 9) for the probes are different. In the same manner, the probe 26b and the probe 26a shown in FIG. 8 are identical except the fact that the positions of the connection portions to the board 28 for the probes are different. Hereinafter, only the differences are described.

As shown in FIG. 9, connection portions 38a' for the probes 16b are arranged on position of the lower surface 28a of the board 28 in which the position is further displaced to the right side from the positions of the connection portions 38a for the probes 18. Connection portions 38b' for the probes 20b are arranged on position of the lower surface 28a for the board 28 in which the position is further displaced to the left side from the positions of the connection portions 38b of the probes 20.

Also, connection portions 38c for the probes 24b are arranged on position of the lower surface 28a of the board 28 in which the position is further displaced the right side from the positions of the connection portions 38a' of the probes 16b. Connection portions 38d of the probes 26b are arranged on position of the lower surface 28a for the board 28 in which the position is further displaced to the left side from the positions of the connection portions 38b' for the probes 20b.

Depending on the position of the connection portion 38a' for the probe 16b shown in this modification example, a probe having the same length as that of the probe 18 can be used as the probe 16b. In the same manner, depending on the position of the connection portion 38b' for the probe 20b, a probe having the same length as that of the probe 22 can be used as the probe 20b.

Third Embodiment

A third embodiment of the probe card according to the present invention will be described with reference to FIGS. 11 and 12.

Figure 11:
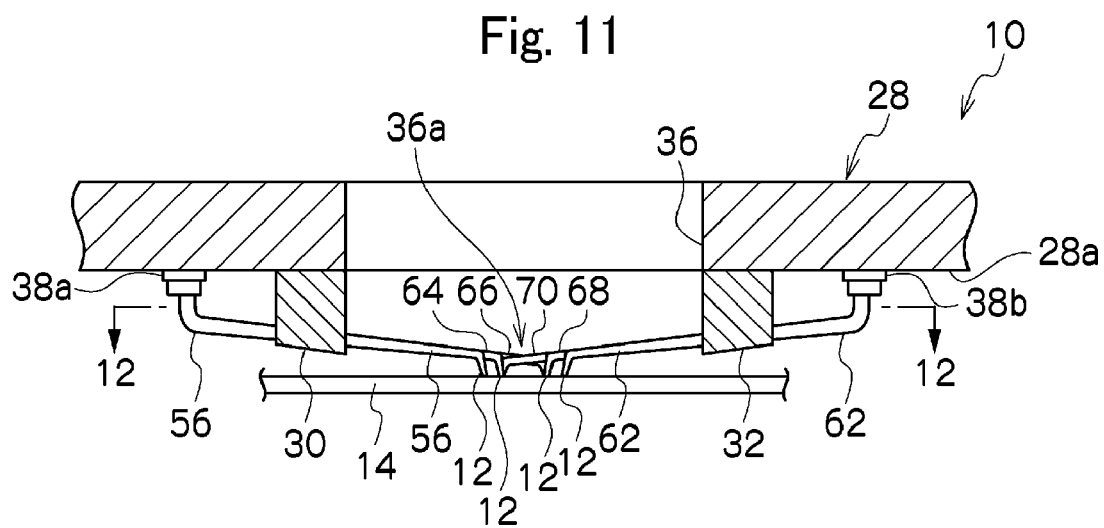
FIG. 11 is a schematic cross-sectional view showing a third embodiment of the probe card according to the present invention together with an electronic device.
Figure 12:
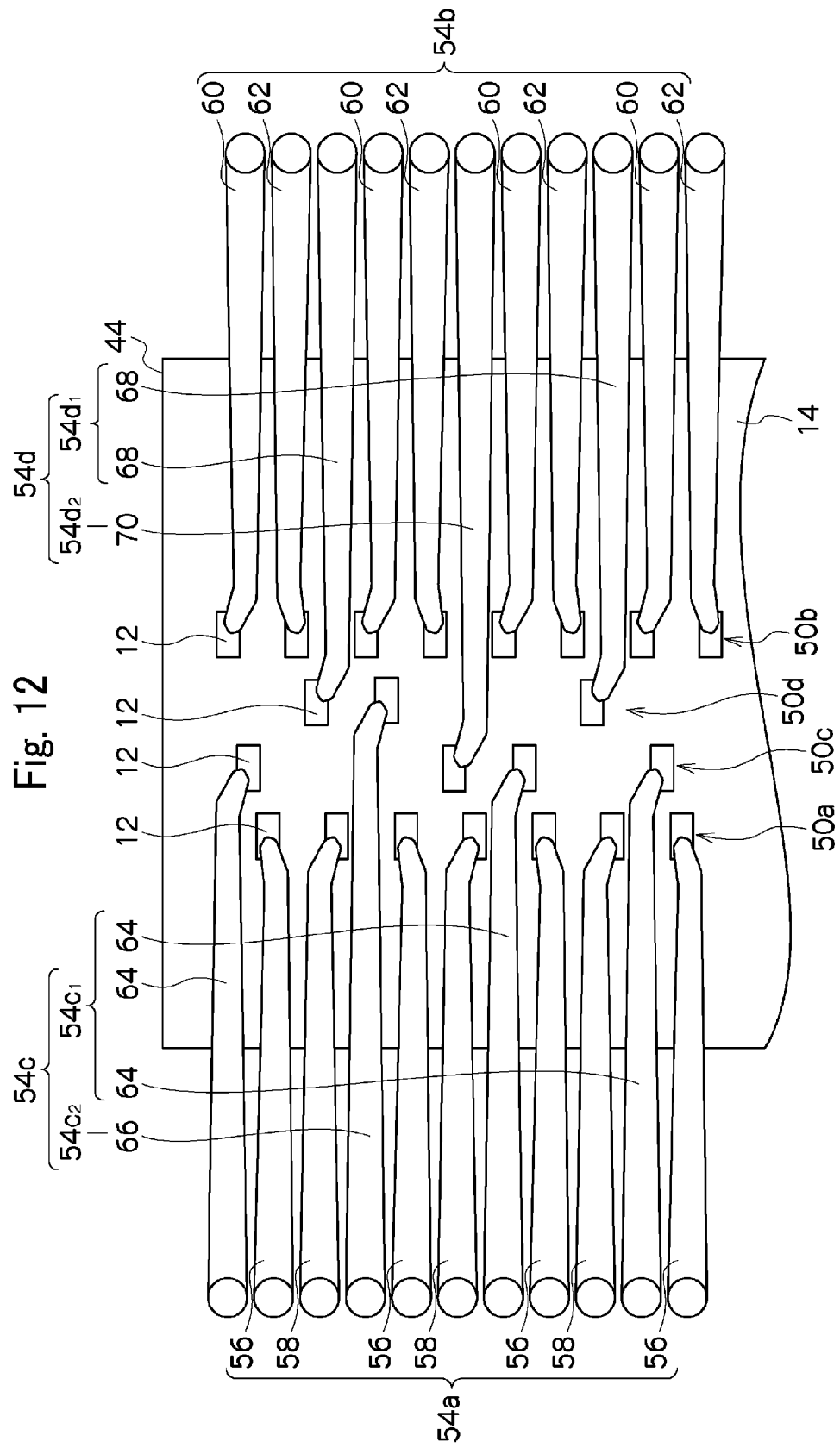
FIG. 12 is an enlarged schematic plan view of a probe arrangement obtained along the line 12-12 in FIG. 11, omitting illustration of needle holders.

FIGS. 11 and 12 show a probe arrangement different from the probe arrangement shown in FIGS. 1 to 3. It is noted that the same components as the components used in the probe card, the electronic device, and the probes shown in FIGS. 1 to 4 are provided with the same reference numerals, and explanation of these is omitted.

In the present embodiment, the electronic device 14 has a plurality of electrodes 12 each of which belongs to any one of first to fourth electrode rows 50a, 50b, 50c and 50d. The electrodes 12 in the first electrode row 50a and the second electrode row 50b are arranged to be equally spaced from one another in each row in the front-back direction, but the electrodes 12 in the third electrode row 50c and the electrodes 12 in the fourth electrode row 50d are arranged to be unequally spaced from one another in each row in the front-back direction, respectively. Also, the electrodes in each electrode row are arranged to be slightly displaced from the electrodes in other electrode rows in their own direction, and there electrode rows are not aligned in the right-left direction.

The first electrode row 50a and the second electrode row 50b are a first row and a last row, respectively, and the third electrode row 50c and the fourth electrode row 50d are intermediate rows. In the first electrode row 50a, seven electrodes 12 are shown, in the second electrode row 50b, eight electrodes 12 are shown, in the third electrode row 50c, four electrodes 12 are shown, and in the fourth electrode row 50d, three electrodes 12 are shown.

Plural probes 56, 58 form a first probe group 54a located on the leftmost side, plural probes 60, 62 form a second probe group 54b located on the rightmost side. Also, plural probes 64, 66 form a third probe group 54c located on the right side of the first probe group 54a, and plural probes 68, 70 form a fourth probe group 54d located on the left side of the second probe group 54b.

The third probe group 54c includes a first probe sub-group 54c1 including a plurality of the probes 64, and a second probe sub-group 54c2 including a plurality of the probes 66 having the probe tip located on the right side of the probe tip of probes belonging to the first probe sub-group 54c1. The fourth probe group 54d includes a first probe sub-group 54d1 including a plurality of the probes 68, and a second probe sub-group 54d2 including a plurality of the probes 70 located on the left side of the probe tip of probes belonging to the first probe sub-group 54d1.

At the time of a test of the electronic device 14, each probe tip of the probes 56 or 58 in the first probe group 54a is brought into contact with the electrode 12 in the first electrode row 60a in one-to-one relationship. Each probe tip of the probes 60 or 62 in the second probe group 54b is contacted with the electrode 12 in the second electrode row 50b in one-to-one relationship.

Each electrode 12 in the third electrode row 50c is contacted in one-to-one relationship by each probe tip of the probe 64 in the third probe group 54c, the probe 66 in the third probe group 54c, the probe 70 in the fourth probe group 54d, and the probe 64 in the third probe group 54c in order of the electrodes closer to the end portion 44 of the electronic device 14.

Each electrode 12 in the fourth electrode row 50d is contacted in one-to-one relationship by each probe tip of the probe 68 in the fourth probe group 54d, the probe 66 in the third probe group 54c, and the probe 68 in the fourth probe group 54d in order of the electrodes closer to the end portion 44 of the electronic device 14.

Each of the first probe group 54a and the second probe group 54b includes a plurality of probes A of the first type and plural probes B of the second type. In the first probe group 54a in the example shown in the figures, the probe 56 (probe A of the first type) and the probe 58 (probe B of the second type) are arranged in order of the probes closer to the end portion 44 of the electronic device 14, and subsequently, the probes are arranged in this order. Also, in the second probe group 54b, the probe 60 (probe B of the second type) and the probe 62 (probe A of the first type) are arranged in order of the probes closer to the end portion 44 of the electronic device 14, and subsequently, the probes are arranged in this order.

Each of the third probe group 54c and the fourth probe group 54d includes a plurality of probes B of the second type. In the example shown in the figures, to the respective electrodes 12 in the third electrode row 50c and the fourth electrode row 50d are arranged the probe 64 in the third probe group 54c, the probe 68 in the fourth probe group 54d, the probe 66 in the third probe group 54c, the probe 70 in the fourth probe group 54d, the probe 64 in the third probe group 54c, the probe 68 in the fourth probe group 54d, and the probe 64 in the third probe group 54c in order of the probes closer to the end portion 44 of the electronic device 14.

Each probe 64 or 66 in the third probe group 54c is located between pairs each consisting of the probes 56 and 58 adjacent to each other belonging to the first probe group 54a which the bending directions of whose probe tip portions intersect each other. Also, each probe 68 or 70 in the fourth probe group 54d is located between a pair of the probes 60 and 62 adjacent to each other in the second probe group 54b, the bending directions of whose probe tip portions intersect each other.

In the present embodiment, the probe tip of each probe in the third probe group 54c is bent in a direction opposite the end portion 44 of the electronic device 14 (backward in the front-back direction), and the probe tip of each probe in the fourth probe group 54d is bent in a direction toward the end portion 44 of the electronic device 14 (forward in the front-back direction).

Modification Example of the Third Embodiment

A modification example of the third embodiment of the probe card according to the present invention will be described with reference to FIGS. 13 and 14.

Figure 13:
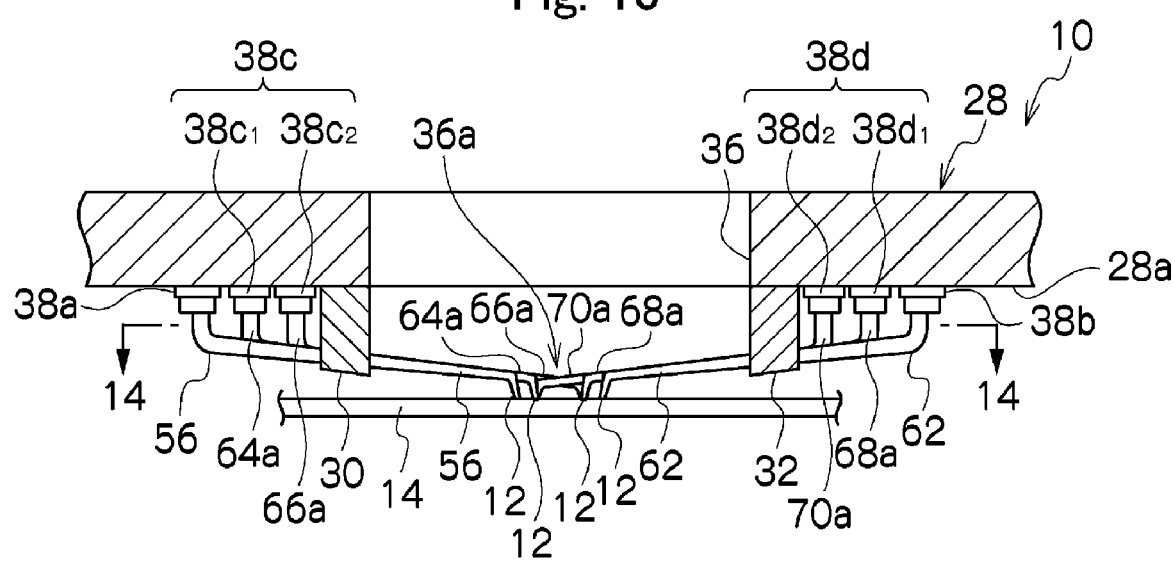
FIG. 13 is a schematic cross-sectional view showing a modification example of the probe card shown in FIG. 11 together with an electronic device.
Figure 14:
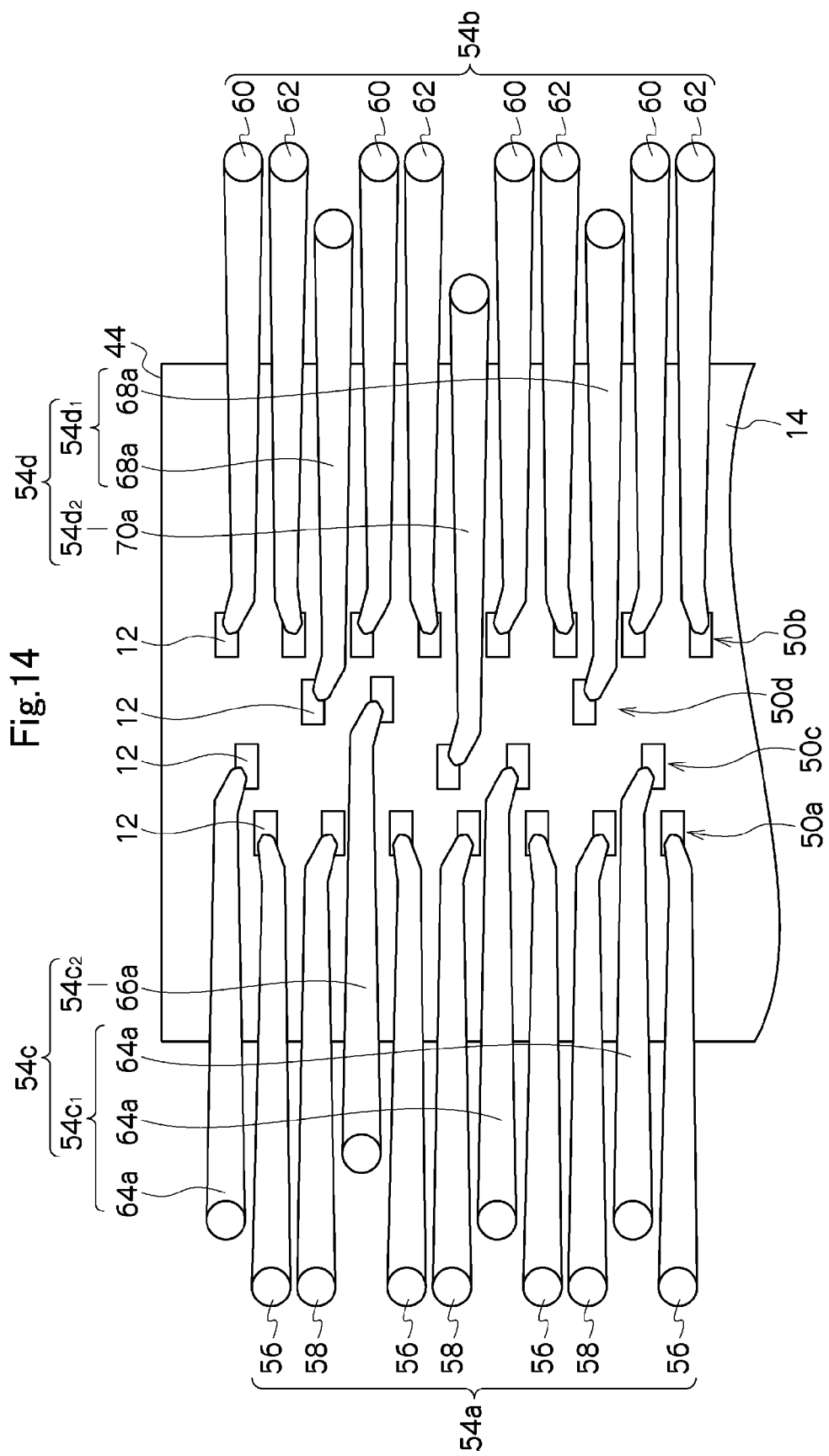
FIG. 14 is an enlarged schematic plan view of a probe arrangement obtained along the line 14-14 in FIG. 13, omitting illustration of needle holders.

FIGS. 13 and 14 show probe arrangement similar to the probe arrangement shown in FIGS. 11 and 12. It is noted that the same components as the components used in the probe arrangement shown in FIGS. 11 and 12 are provided with the same reference numerals, and explanation of these is omitted.

As shown in FIG. 14, the third probe group 54c includes a first probe sub-group 54c1 and a second probe sub-group 54c2. The first probe sub-group 54c1 includes a plurality of the probes 64a, and the second probe sub-group 54c2 includes a plurality of the probes 66a (only one probe 66a is shown in the figure).

The probe 64a shown in FIG. 14 and the probe 64 shown in FIG. 12 are identical except the fact that the positions of the connection portions to the board 28 for the probes are different. In the same manner, the probe 66a shown in FIG. 14 and the probe 66 shown in FIG. 12 are identical except the fact that the positions of the connection portions to the board 28 for the probes are different.

The probe 68a shown in FIG. 14 and the probe 68 shown in FIG. 12 are identical except the fact that the positions of the connection portions to the board 28 for the probes are different. In the same manner, the probe 70a shown in FIG. 14 and the probe 70 shown in FIG. 12 are identical except the fact that the positions of the connection portions of the board 28 for the probes are different. Hereinafter, only the differences are described.

As shown in FIG. 13, connection portions 38c1 for the probes 64a are arranged on the lower surface 28a of the board 28 further to the right side from the positions of the connection portions 38a for the probes 56, 58. Also, connection portions 38c2 for the probes 66a are arranged on the lower surface 28a of the board 28 further to the right side from the positions of the connection portions 38c1 for the probes 64a.

In the same manner, connection portions 38d1 for the probes 68a are arranged on the lower surface 28a of the board 28 further to the left side from the positions of the connection portions 38b for the probes 60, 62. Also, connection portions 38d2 for the probes 70a are arranged on the lower surface 28a of the board 28 further to the left side from the positions of the connection portions 38d1 for the probes 68a.

Depending on the positions of the connection portion 38c1 for the probe 64a and the connection portion 38c2 for the probe 66a shown in this modification example, a probe having the same shape and the same length as those of the probe 58 can be used as the probe 64a or 66a. In the same manner, depending on the positions of the connection portion 38d1 for the probe 68a and the connection portion of the probe 70a, a probe having the same shape and the same length as those of the probe 60 can be used as the probe 68a or 70a.

Although needle-type probes are used in the foregoing embodiments and their modification examples, the present invention can be applied to plate-shaped, so-to-speak, "blade-type" probes as described in International Publication WO2004/102207.

The present invention is not limited to the above embodiments but may be altered in various ways without departing from the spirit and scope of claims.

What is claimed is:

1. A probe card comprising:
a board having a lower surface on which a plurality of connection portions are arranged; and
first, second, third, and fourth probe groups each including a respective plurality of probes, and each of said probes having a probe base portion connected to one of said connection portions at its upper end, a probe main body portion extending in a right-left direction from a lower end of said probe base portion, and a probe tip portion extending downward from a tip end of said probe main body portion and having a probe tip at its lower end,
wherein said probe main body portions of said probes in said first and third probe groups extend from the lower ends of said corresponding probe base portions to a side of said probes in said second and fourth probe groups;
wherein said probe main body portions of said probes in said second and fourth probe groups extend from the lower ends of said corresponding probe base portions to the side of said probes in said first and third probe groups;
wherein said probe tips of said probes in said third and fourth probe groups are bent to one or the other side in a front-back direction relative to a longitudinal axis of the respective probe main body portions;
wherein said probe tips of said probes in said third and fourth probe groups are located alternately in said front-back direction;
wherein said probe tip portion of each of said plurality of probes belonging to said first and second probe group is bent to one or the other side in said front-back direction of a vertical surface including a longitudinal axis of said probe main body portion; and
wherein a direction in which said probe tip portion of each said probe in said third probe group is bent and a direction in which said probe tip portion of each said probe in said fourth probe group is bent are different from each other.

2. The probe card according to claim 1, wherein said plurality of connection portions belong to one or the other of first and second connection portion groups, and said connection portions belonging to said first connection portion group and said connection portions belonging to said second connection portion group are arranged on the lower surface of said board to be spaced in said right-left direction.

3. The probe card according to claim 1, wherein directions in which said probe tip portions of two probes belonging to said probes in said first probe group, said two probes being most adjacent to said probes in said third probe group, are bent are different from each other, and directions in which said probe tip portions of two probes belonging to said probes in said second probe group, said two probes being most adjacent to said probes in said fourth probe group, are bent are different from each other.

4. The probe card according to claim 3, wherein said probe tips of said probe tip portions of said most adjacent two probes belonging to said probes in said first probe group are mutually displaced in said right-left direction, and said probe tips of said probe tip portions of said most adjacent two probes belonging to said probes in said second probe group are mutually displaced in said front-back direction.

5. The probe card according to claim 1, wherein said probe tips are located on an imaginary straight line extending in said front-back direction.

6. The probe card according to claim 1, wherein each of said third and fourth probe groups includes at least two probe sub-groups.

7. The probe card according to claim 6, wherein said probe tips of said probes in said two probe sub-groups are located in a configuration of two rows in said front-back direction, and said probe tips in each row are located on an imaginary straight line extending in said front-back direction.

* * * * *